United States Patent
Kale et al.

(10) Patent No.: US 11,792,510 B2
(45) Date of Patent: Oct. 17, 2023

(54) IMAGE SENSOR DATA MANAGEMENT USING A MULTI-PORT MEMORY DEVICE

(71) Applicant: Micron Technology, Inc., Boise, ID (US)

(72) Inventors: Poorna Kale, Folsom, CA (US); Richard C. Murphy, Boise, ID (US); Amit Gattani, Granite Bay, CA (US)

(73) Assignee: Micron Technology, Inc., Boise, ID (US)

( * ) Notice: Subject to any disclaimer, the term of this patent is extended or adjusted under 35 U.S.C. 154(b) by 212 days.

(21) Appl. No.: 16/951,944

(22) Filed: Nov. 18, 2020

(65) Prior Publication Data
US 2022/0159180 A1    May 19, 2022

(51) Int. Cl.
*H04N 23/60* (2023.01)
*H04N 23/80* (2023.01)
*G11C 11/4076* (2006.01)
*G11C 11/4096* (2006.01)

(52) U.S. Cl.
CPC ....... *H04N 23/665* (2023.01); *G11C 11/4076* (2013.01); *G11C 11/4096* (2013.01); *H04N 23/80* (2023.01)

(58) Field of Classification Search
CPC .. H04N 1/2112; H04N 1/2137; H04N 23/665; H04N 23/80; G11C 11/4076; G11C 11/4096; G11C 7/062; G11C 7/067; G11C 2207/063; G11C 7/16; G11C 7/1006
See application file for complete search history.

(56) References Cited

U.S. PATENT DOCUMENTS

| | | | |
|---|---|---|---|
| 8,804,009 B2 | 8/2014 | Cho | |
| 2004/0201684 A1* | 10/2004 | Janson, Jr. | H04N 1/2112 348/207.1 |
| 2005/0213661 A1* | 9/2005 | Xiang | H04N 19/43 375/E7.101 |
| 2007/0177028 A1 | 8/2007 | Kyoung | |
| 2008/0291215 A1 | 11/2008 | Schick et al. | |

(Continued)

FOREIGN PATENT DOCUMENTS

KR    20100125744    12/2010

OTHER PUBLICATIONS

International Search Report from related PCT Application No. PCT/US2021/059541, dated Mar. 4, 2022, 10 pages.

(Continued)

*Primary Examiner* — Hung H Lam
(74) *Attorney, Agent, or Firm* — Brooks, Cameron & Huebsch, PLLC (57) ABSTRACT

A memory device can be configured to receive data, via a first port, from an image sensor coupled thereto. The memory device can be further configured to perform an image processing operation on the data. The image processing operation can be performed using logic circuitry of the memory device. The memory device can be configured to transmit operated-on data from the memory device to image signal processing (ISP) circuitry via a second port of the memory device. Pulling data directly from an image sensor, via a memory device, can reduce data transfers, reduce resource consumption, and offload workloads from ISP circuitry, a host device, and/or a host processing device, for example.

19 Claims, 4 Drawing Sheets

(56) References Cited

U.S. PATENT DOCUMENTS

| | | | | |
|---|---|---|---|---|
| 2013/0058573 A1* | 3/2013 | Suzuki | ................. | H04N 23/80 |
| | | | | 382/167 |
| 2014/0022399 A1 | 1/2014 | Rashid | | |
| 2015/0181148 A1 | 6/2015 | Slovick et al. | | |
| 2020/0106948 A1* | 4/2020 | Li | ....................... | H04N 23/611 |
| 2021/0099665 A1* | 4/2021 | McGarvey | ............... | G06T 1/20 |
| 2022/0159132 A1* | 5/2022 | Kale | ................. | H04N 1/00193 |

OTHER PUBLICATIONS

"Samsung's Newest ISOCELL Image Sensor Enables Mobile Devices to 'Slow Down' Time", Samsung Newsroom U. S., (4 pgs.), retrieved Jun. 10, 2020 from https://news.samsung.com/us/samsungs-isocell-image-sensor-3-stack-isocell-fast-2L3/.

James, Dick, "Sony Embed DRAM in Image Sensors", EET Asia, Jun. 6, 2017, (5 pgs.), retrieved from https://www.eetasia.com/sony-embeds-dram-in-image-sensors/.

\* cited by examiner

IMAGE SENSOR DATA MANAGEMENT USING A MULTI-PORT MEMORY DEVICE

TECHNICAL FIELD

The present disclosure relates generally to memory devices, and more particularly, to apparatuses and methods related to image sensor data management using a multi-port memory device.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory is also utilized as volatile and non-volatile data storage for a wide range of electronic applications. Non-volatile memory may be used in, for example, personal computers, portable memory sticks, digital cameras, cellular telephones, portable music players such as MP3 players, movie players, and other electronic devices. Memory cells can be arranged into arrays, with the arrays being used in memory devices.

DETAILED DESCRIPTION

The present disclosure includes apparatuses and methods related to pulling data directly from an image sensor using a memory device. In some previous approaches, image signal processing (ISP) circuitry may be employed to operate on data from an image sensor. For example, ISP circuitry may perform preprocessing operations on data from an image sensor. The preprocessed data may then be communicated to a memory device. In such previous approaches, ISP circuitry serves as an intermediary between an image sensor and a memory device to which data from the image sensor is to be stored. Such previous approaches may rely on signaling, from an external source such as a host device, indicative of commands to direct operations performed by ISP circuitry and/or communication of data from an image sensor to ISP circuitry and/or a memory device.

Some previous approaches may include multiple data transfers. As described above, there may be data transfers from an image sensor to ISP circuitry and from the ISP circuitry to a memory array for each set of data output or retrieved from the image sensor. Each data transfer may include multiple operations. For example, a data transfer may include one or more read operations, one or more decompression operations, and/or one or more compression operations. The data transfers, and their associated operations, may increase the consumption of resources (e.g., power, time, etc.) of a system including an image sensor, ISP circuitry, and a memory array (e.g., an imaging system).

In some previous approaches, throughput of data from an image sensor may be limited by intermediary ISP circuitry. Data from the image sensor may be communicated to ISP circuitry for preprocessing. Additional data from the image sensor cannot be communicated to the ISP circuitry until the ISP circuitry outputs the preprocessed data. Thus, the rate at which data can be communicated from an image sensor is constrained by an amount of data that ISP circuitry can operate on concurrently and/or an amount of time needed by the ISP circuitry to process data.

At least one embodiment of the present disclosure addresses shortcomings and other issues associated with some previous approaches, such as the shortcomings and issues described herein, by enabling a memory device to pull data directly from an image sensor via a port of the memory device. As used herein, a "port" of a memory device refers to a distinct physical and logical interface of the memory device. Unless indicated otherwise, the terms "port" and "interface" are used interchangeably herein. A port may include multiple physical connections such as pins. Examples of ports include serial ports (e.g., a camera serial interface operated according to a mobile industry processor interface (MIPI) protocol) and memory ports (e.g., a double data rate (DDR) interface). In some embodiments, the memory device is directly coupled to the image sensor via a first port, which can be a serial interface, for example, and the memory device is coupled to ISP circuitry via a second port, which can be a parallel interface. The memory device can have another port for interfacing with a host device. As described herein, at least one embodiment of the present disclosure includes a memory device configured to perform image processing operations on data pulled from an image sensor and/or data written to the memory device from an image sensor.

At least one embodiment of the present disclosure improves performance of an imaging system because the imaging system includes a memory device being physically closer to an image sensor as compared to some previous approaches. By directly coupling an image sensor to a memory device or reducing the quantity of components on a data path between the image sensor and the memory device, the quantity of data transfers between components of an imaging system are reduced. As used herein, "directly coupled" refers to a connection of two components (e.g., by direct physical contact). Directly coupling a memory device to an image sensor can enable the memory device to pull data directly from the image sensor. Instead of waiting for an indication that the image sensor has data to be written to the memory device, the memory device actively pulls data from the image sensor. The memory device and the image sensor can have a "master-slave" relationship in which the memory device is a master and the image sensor is a slave. Reducing the quantity of data transfers can reduce the resources consumed by or required by an imaging system.

At least one embodiment of the present disclosure improves performance of imaging systems because the memory device does not merely provide storage for data. Rather, the memory device directs communication of data to and from components of an imaging system. The memory device and other components of the imaging system can have a "master-slave" relationship in which the memory device is the master and the other components are slaves. Instead of a component external to the memory device (e.g., a peripheral device) or a component external to the imaging system (e.g., a host device) directing communication of data between components of an imaging system, the memory device directs communication of data between components of the imaging system. This enables data to be retrieved from an image sensor by a memory device coupled thereto while ISP circuitry of the imaging system processes data previously retrieved from the image sensor by the memory device.

To further improve the performance of the imaging system, in at least one embodiment of the present disclosure, the memory device can include logic circuitry configured to perform operations, such as image processing operations, on data written to the memory device. The memory device can perform pre-processing of data retrieved from the image sensor by the memory device prior to communicating the data to ISP circuitry. Performing one or more image processing operations on data prior to communicating the data to ISP circuitry can enable the data to be in a format that is better suited for processing by the ISP circuitry. ISP circuitry can require large amounts of resources (e.g., power, time) to process data. Pre-processing data using the memory device can reduce the quantity of operations performed by the ISP circuitry thereby reducing the resources consumed by the ISP circuitry. Reducing the quantity of operations performed by the ISP circuitry can also reduce the amount of time that the ISP circuitry processes data such that data can be communicated from the ISP circuitry to a peripheral device coupled to the imaging system in less time than some previous approaches.

A memory device can be configured to receive data. via a port of the memory device, from an image sensor coupled thereto. The memory device can perform an image processing operation on the pulled data using logic circuitry of the memory device. As explained in more detail below, receiving data from an image sensor via a memory device can reduce data transfers, reduce resource consumption of an imaging system, and offload workloads from ISP circuitry and/or other peripheral devices, for example.

Performing image processing operations on data from an image sensor, by a memory device, can offload workloads from a host device or a host processing device because, in some previous approaches, a host device or a host processing device may direct pre-processing of data by providing instructions to ISP circuitry, for example. At least one embodiment can reduce the quantity of data transfers as compared to some previous approaches because data can be pulled directly from an image sensor to a memory device while still enabling preprocessing of data by the memory device. Thus, at least one embodiment of the present disclosure can reduce resource consumption and/or resource requirements of an imaging system as compared to some previous approaches because fewer data transfers, and operations associated therewith, are needed.

As used herein, the singular forms "a," "an," and "the" include singular and plural referents unless the content clearly dictates otherwise. Furthermore, the word "may" is used throughout this application in a permissive sense (i.e., having the potential to, being able to), not in a mandatory sense (i.e., must). The term "include," and derivations thereof, mean "including, but not limited to." The term "coupled" means directly or indirectly connected.

The figures herein follow a numbering convention in which the first digit or digits correspond to the drawing figure number and the remaining digits identify an element or component in the drawing. Similar elements or components between different figures may be identified by the use of similar digits. For example, 102 may reference element "102" in FIG. 1, and a similar element may be referenced as 302 in FIG. 3. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention and should not be taken in a limiting sense.

Figure 1:
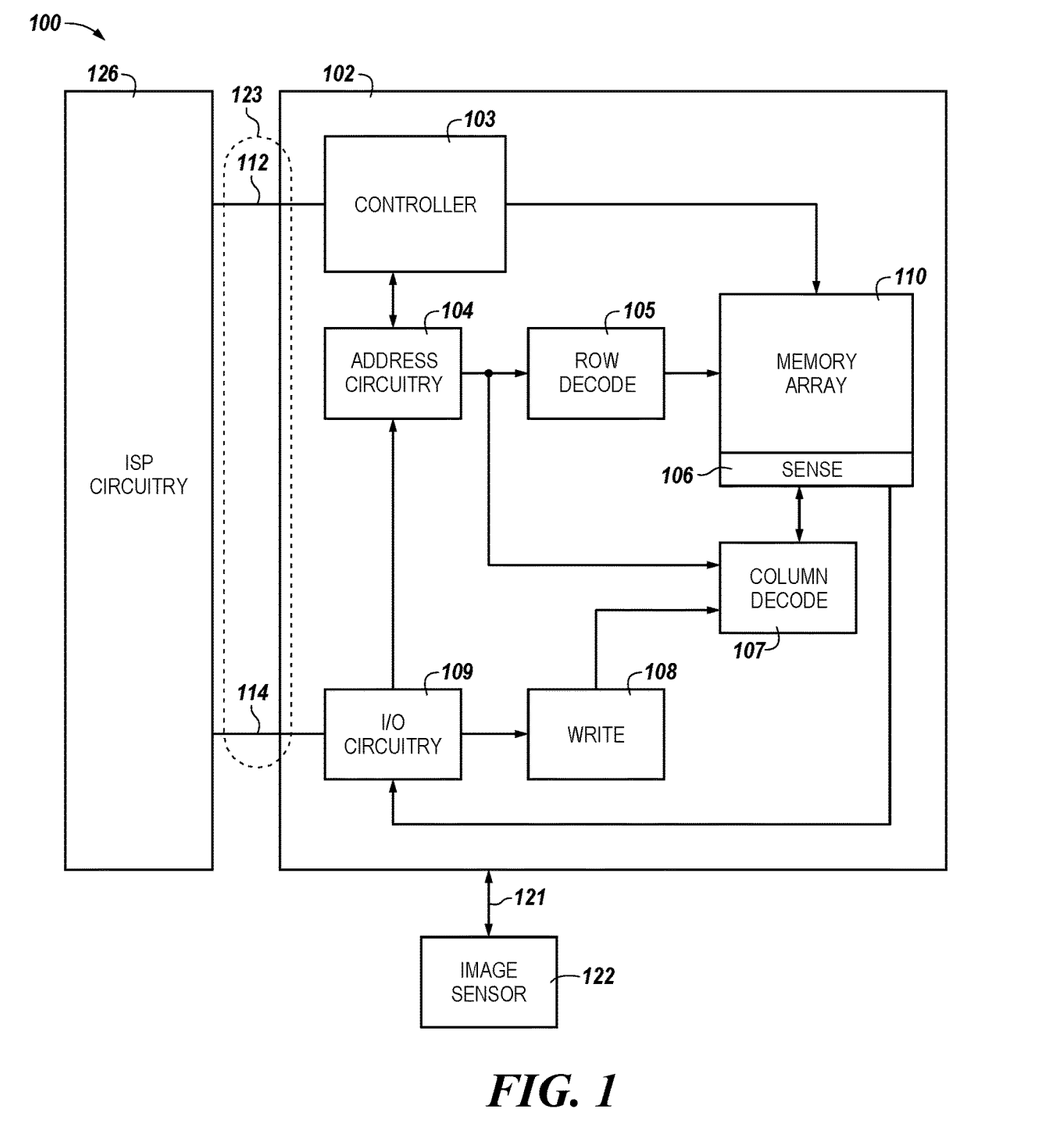
FIG. 1 is a block diagram of an apparatus in the form of a system in accordance with a number of embodiments of the present disclosure.

FIG. 1 is a block diagram of an apparatus in the form of a system 100 including a memory device 102 in accordance with a number of embodiments of the present disclosure. As used herein, a memory device 102, a controller 103, a memory array 110, and/or sensing circuitry 106 might also be separately considered an "apparatus."

Figure 5:
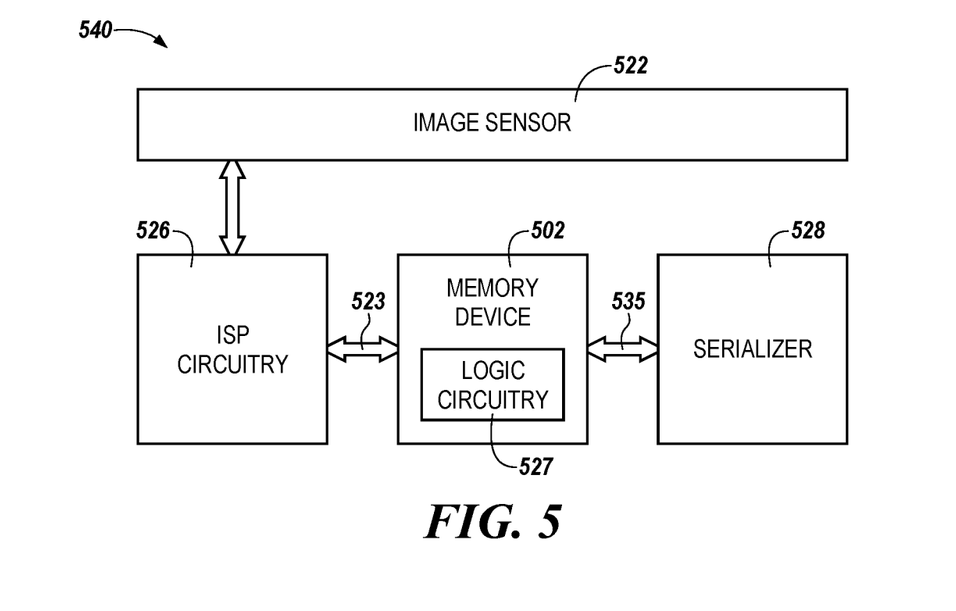
FIG. 5 is a block diagram of a system for directing, by a memory device, communication and processing of data from an image sensor in accordance with a number of embodiments of the present disclosure.

The system 100 includes a host device 126, which is labeled as "ISP circuitry," coupled to the memory device 102, which includes a memory array 110. Examples of the host device 126 include a personal laptop computer, a desktop computer, a digital camera, a smart phone, a memory card reader, or a vehicle (e.g., an autonomous vehicle), among various other types of devices. In some embodiment, the host device 126 can include a system motherboard and/or backplane and can include a number of processing resources (e.g., one or more processors, microprocessors, or some other type of controlling circuitry), but at least includes ISP circuitry as described herein. Hereinafter, the host device 126 is referred to as ISP circuitry 126, without so limiting the host device. The system 100 can include separate integrated circuits or both the ISP circuitry 126 and the memory device 102 can be on the same integrated circuit. As illustrated by FIG. 1, the ISP circuitry 126 is not directly coupled to an image sensor 122. Embodiments of the present disclosure are not limited to the coupling of the image sensor 122 and the ISP circuitry 126 as illustrated by FIG. 1. For example, as described in association with FIG. 5, ISP circuitry can be directly coupled to an image sensor and a memory device can be directly coupled to the ISP circuitry.

For clarity, the system 100 has been simplified to focus on features with particular relevance to the present disclosure. The memory array 110 can be a hybrid memory cube (HMC), computational memory such as a processing-in-memory random access memory (PIMRAM) array, DRAM array, static random access memory (SRAM) array, spin-transfer torque random access memory (STT RAM) array, PCRAM array, thyristor random access memory (TRAM) array, RRAM array, NAND flash array, and/or NOR flash array, for instance. The memory array 110 can comprise memory cells arranged in rows coupled by access lines, which may be referred to herein as word lines or select lines, and columns coupled by digit lines, which may be referred to herein as bit lines, data lines, or sense lines. Although a single memory array 110 is shown in FIG. 1, embodiments are not so limited. For instance, the memory device 102 may include a number of memory arrays 110 (e.g., a number of banks of DRAM cells, NAND flash cells, etc.).

The memory device 102 can include address circuitry 104 to latch address signals for data provided over an input/output "I/O" bus 114 (e.g., data bus and/or address bus) through I/O circuitry 109 (e.g., provided to external ALU circuitry and to DRAM DQs via local I/O lines and global I/O lines). Address signals are received through address circuitry 104 and decoded by a row decoder 105 and a column decoder 107 to access the memory array 110. Data can be read from the memory array 110 by sensing voltage and/or current changes on the digit lines using the sensing circuitry 106. The sensing circuitry 106 can read and latch a page (e.g., row) of data from the memory array 110. The I/O circuitry 109 can be used for bi-directional data communication with the ISP circuitry 126 over the I/O bus 114. In a number of embodiments, sensing circuitry 106 can include a number of sense amplifiers and a respective number of compute components as will be discussed further herein. The write circuitry 108 can be used to write data to the memory array 110.

The controller 103 (e.g., memory controller) decodes signals provided by the control bus 112 from the ISP circuitry 126. These signals can include chip enable signals, write enable signals, and address latch signals that are used to control operations performed on the memory array 110, including data read, data write, and data erase operations. In various embodiments, the controller 103 is responsible for executing instructions from the ISP circuitry 126 and sequencing access to the memory array 110. The controller 103 can be a state machine, sequencer, or some other type of controller, and include hardware and/or firmware (e.g., microcode instructions) in the form of an application specific integrated circuit (ASIC). The controller 103 can control, for example, generation of clock signals and application of the clock signals to a compute component in sensing circuitry in association with shifting data.

As illustrated by FIG. 1, the memory device 102 can be a multi-port memory device. The control bus 112 and the I/O bus 114 can be referred to, collectively, as a port 123 of the memory device 102. FIG. 1 illustrates an image sensor 122 directly coupled to the memory device 102 via port 121 and the ISP circuitry 126 directly coupled to the memory device 102 via port 123. Although the port 121 is illustrated more generically than the port 123, the port 121 can include, for example, a connection to the I/O circuitry 109 or other I/O circuitry (not specifically illustrated).

Although not illustrated in FIG. 1, the memory device 102 can include control circuitry, such as the controller 103, for example, configured to pull data directly from an image sensor. The control circuitry can be configured to write the pulled data to the memory array 110. The control circuitry can be configured to direct performance of an image processing operation on the pulled data via logic circuitry of the memory device 102. The control circuitry can be configured to direct communication of data to and/or from the ISP circuitry 126 coupled to the memory device 102. The memory device 102 can direct communication of data from peripheral devices (e.g., the image sensor 122 or another peripheral device not specifically illustrated) without communicating the data to and/or from the memory device 102 itself. For example, the memory device 102 can direct communication of data from the image sensor 122 to the ISP circuitry 126. Although not illustrated in FIG. 1, the memory device 102 can include circuitry configured to direct communication of data from the image sensor 122.

The control circuitry can be configured to direct communication of data from the memory device 102 to the ISP circuitry 126. The control circuitry can be configured to direct communication of data from the image sensor 122 to the ISP circuitry 126 without communicating the data to or from the memory device 102. Similarly, the control circuitry can be configured to direct communication of data from the ISP circuitry 126 to another host or peripheral deice without communicating the data to or from the memory device 102. The control circuitry can be configured to direct communication of operated-on data from the memory device 102. The control circuitry can be configured to direct communication of the operated-on data from the memory device 102 to the ISP circuitry 126. Embodiments of the present disclosure described in association with FIGS. 3-5 describe receiving data (e.g., pulling data directly) directly from the image sensor 122 using the memory device 102 in further detail.

In a number of embodiments, the sensing circuitry 106 can be used to perform logical operations using data stored in the memory array 110 as inputs and/or store the results of the logical operations back to the memory array 110 without transferring data via a digit line address access (e.g., without firing a column decode signal). As such, various compute functions can be performed using, and within, the sensing circuitry 106 rather than (or in association with) being performed by processing resources external to the sensing circuitry 106 (e.g., by a processing resource associated with the ISP circuitry 126 and/or other processing circuitry, such as ALU circuitry, located on the memory device 102 (e.g., on the controller 103 or elsewhere)). The sensing circuitry 106 can be configured to perform one or more image processing operations on data written to the memory array 110. Non-limiting examples of image processing operations include a compression operation; a frame buffer operation; an encoding, decoding, or scaling operation; a color space conversion operation; and an attention finding operation.

In various previous approaches, data associated with an operand, for instance, would be read from memory via sensing circuitry and provided to external ALU circuitry via I/O lines (e.g., via local I/O lines and/or global I/O lines). The external ALU circuitry could include a number of registers and would perform compute functions using the operands, and the result would be transferred back to the array via the I/O lines. In contrast, in a number of embodiments of the present disclosure, the sensing circuitry 106 is configured to perform logical operations on data stored in the memory array 110 and store the result back to the memory array 110 without enabling an I/O line (e.g., a local I/O line) coupled to the sensing circuitry 106.

As such, in a number of embodiments, circuitry external to the memory array 110 and sensing circuitry 106 is not needed to perform compute functions as the sensing circuitry 106 can perform the appropriate logical operations to perform such compute functions without the use of an external processing resource. Therefore, the sensing circuitry 106 may be used to complement and/or to replace, at least to some extent, such an external processing resource (or at least the bandwidth consumption of such an external processing resource).

However, in a number of embodiments, the sensing circuitry 106 may be used to perform logical operations (e.g., to execute instructions) in addition to logical operations performed by an external processing resource (e.g., the ISP circuitry 126). For instance, the ISP circuitry 126 and/or sensing circuitry 106 may be limited to performing only certain logical operations and/or a certain number of logical operations.

In a number of embodiments, the sensing circuitry 106 can be formed on a same pitch as a pair of complementary sense lines of the array. For example, the cells of a memory array may have a $4F^2$ or $6F^2$ cell size, where "F" is a feature size corresponding to the cells. As an example, a pair of complementary memory cells may have a cell size with a $6F^2$ pitch (e.g., 3F×2F). If the pitch of a pair of complementary sense lines for the complementary memory cells is 3F, then the sensing circuitry being on pitch indicates the sensing circuitry (e.g., a sense amplifier and corresponding compute component per respective pair of complementary sense lines) is formed to fit within the 3F pitch of the complementary sense lines.

Enabling an I/O line can include enabling (e.g., turning on) a transistor having a gate coupled to a decode signal (e.g., a column decode signal) and a source/drain coupled to the I/O line. However, embodiments are not limited to performing logical operations using sensing circuitry (e.g., the sensing circuitry 106) without enabling column decode lines of the memory array 110. Whether or not local I/O lines are used in association with performing logical operations via sensing circuitry 106, the local I/O line(s) may be enabled in order to transfer a result to a suitable location other than back to the memory array 110 (e.g., to an external register).

Figure 2:
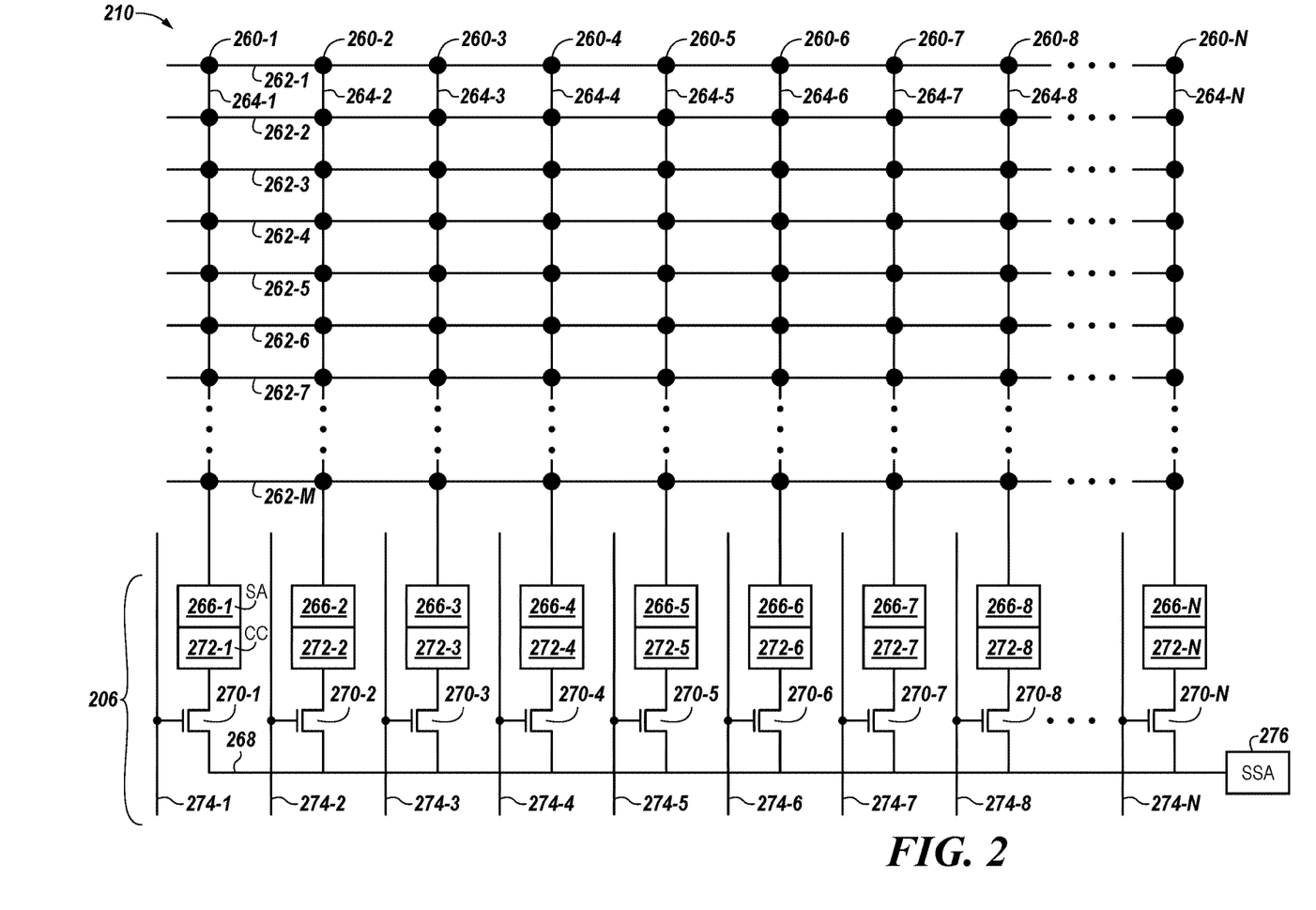
FIG. 2 is a schematic diagram of a portion of a memory array in accordance with a number of embodiments of the present disclosure.

FIG. 2 is a schematic diagram of a portion of a memory array 210 in accordance with a number of embodiments of the present disclosure. The memory array 210 can be analogous to the memory array 110 described in association with FIG. 1. The memory array 210 can include memory cells 260-1, 260-2, 260-3, 260-4, 260-5, 260-6, 260-7, 260-8, . . . , 260-N coupled to rows of access lines 262-1, 262-2, 262-3, 262-4, 262-5, 262-6, 262-7, . . . , 262-M and columns of sense lines 264-1, 264-2, 264-3, 264-4, 264-5, 264-6, 264-7, 264-8, . . . , 264-N. The memory array 210 is not limited to a particular number of access lines and/or sense lines, and use of the terms "rows" and "columns" does not intend a particular physical structure and/or orientation of the access lines and/or sense lines. Although not illustrated by FIG. 2, each column of memory cells can be associated with a corresponding pair of complementary sense lines.

Each column of memory cells can be coupled to sensing circuitry 206, which can be analogous to the sensing circuitry 106 described in association with FIG. 1. In this example, the sensing circuitry 206 includes a number of sense amplifiers 266-1, 266-2, 266-3, 266-4, 266-5, 266-6, 266-7, 266-8, . . . , 266-N coupled to the respective sense lines 264. The sense amplifiers 266 are coupled to input/output (I/O) line 268 (e.g., a local I/O line) via access devices (e.g., transistors) 270-1, 270-2, 270-3, 270-4, 270-5, 270-6, 270-7, 270-8, . . . , 270-N. In this example, the sensing circuitry also includes a number of compute components 272-1, 272-2, 272-3, 272-4, 272-5, 272-6, 272-7, 272-8, . . . , 272-N coupled to the respective sense lines 264. Column decode lines 274-1, 274-2, 274-3, 274-4, 274-5, 274-6, 274-7, 274-8, . . . , 274-N are coupled to the gates of access devices 270, respectively, and can be selectively activated to transfer data sensed by respective sense amps 266 and/or stored in respective compute components 272 to a secondary sense amplifier 276. In a number of embodiments, the compute components 272 can be formed on pitch with the memory cells of their corresponding columns and/or with the corresponding sense amplifiers 266.

In a number of embodiments, the sensing circuitry (e.g., compute components 272 and sense amplifiers 266) is configured to perform a number of logical operations on elements stored in the memory array 210. As an example, a first plurality of elements can be stored in a first group of memory cells coupled to a particular access line (e.g., access line 262-1) and to a number of sense lines 264, and a second plurality of elements can be stored in a second group of memory cells coupled to a different access line (e.g., access line 262-2) and the respective number of sense lines 264. Each element of the first plurality of elements can have a logical operation performed thereon with a respective one of the second plurality of elements, and the result of the logical operation can be stored (e.g., as a bit-vector) in a third group of memory cells coupled to a particular access line (e.g., access line 262-3) and to the number of sense lines 264.

Figure 3:
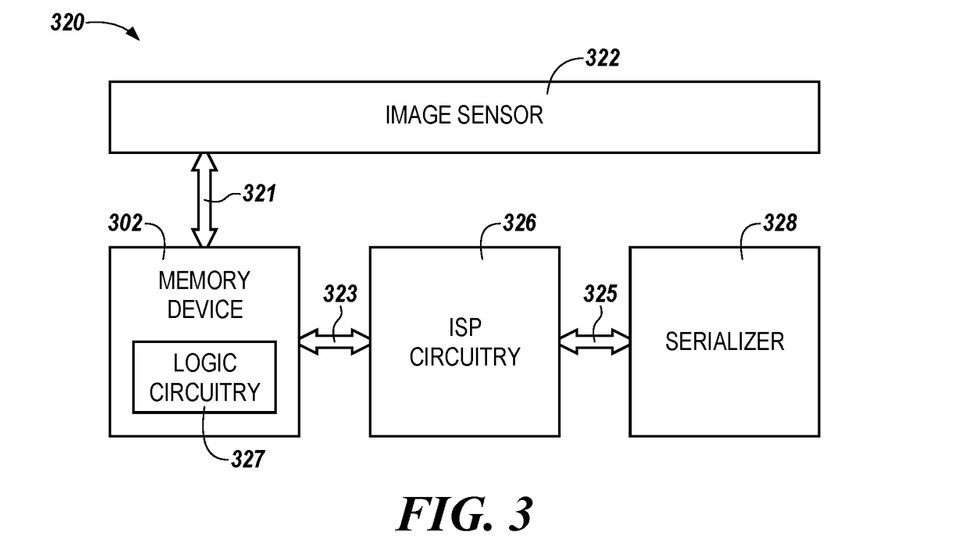
FIG. 3 is a block diagram of a system for pulling data directly from an image sensor using a memory device in accordance with a number of embodiments of the present disclosure.

FIG. 3 is a block diagram of a system 320 for pulling data directly from an image sensor 322 using a memory device 302 in accordance with the present disclosure. Each of the components of the system 320 can be on a separate chip. However, the system 320 can be a stack of chips. The image sensor 322 can be directly coupled to the memory device 302. The memory device 302 can be directly coupled to ISP circuitry 326.

In contrast to some previous approaches, the image sensor 322 is not directly coupled to the ISP circuitry 326. For example, in contrast to some previous approaches, the memory device 302 does not include through-silicon vias (TSVs) so that the image sensor 322 is coupled to the ISP circuitry 326. In contrast to some previous approaches, the memory device 302 can be configured to ingest data from the image sensor 322 rather than the ISP circuitry 326. The memory device 302 is coupled between the image sensor 322 and the ISP circuitry 326.

In at least one embodiment, the port 321 can be a serial interface. A serial interface between the image sensor 322 and the memory device 302 can reduce the quantity of pins needed to couple the memory device 302 to the image sensor 322. Thus, the port 321 occupies a smaller space on the memory device 302.

In at least one embodiment, the port 323 can be a parallel interface. A parallel interface provides an increased data rate because more data can be communicated from the memory device 302 to the ISP circuitry 326 concurrently.

At least one embodiment can include the port 321 being a serial interface and the port 323 being a parallel interface. These embodiments can provide a low pin-count between the image sensor 322 and the memory device 302 while still providing the bandwidth of a parallel interface between the memory device 302 and the ISP circuitry 326 for accessing the memory device 302.

As illustrated by FIG. 3, the system 320 includes a serializer 328 coupled to the memory device via an interface 325. The interface 325 can be a parallel interface which is converted to a serial interface by the serializer 328. The serializer 328 can be configured to communicate data from the ISP circuitry 326 to a component external to the system 320 (not shown). Examples of components external to the system 320 include, but are not limited to, a host device and a host processing device. A host device and/or a host processing device can be a component of a vehicle (e.g., an autonomous vehicle). Although FIG. 3 illustrates the serializer 328 as a separate component, in at least one embodiment the serializer 328 can be a component of the ISP circuitry 326.

The memory device 302 can include an array of memory cells, such as the memory array 110 described in association with FIG. 1. The memory device 302 can be configured to receive (e.g., retrieve and/or pull) data from the image sensor 322. The memory device 302 can be configured to retrieve and/or pull data directly from the image sensor 322. Data from the image sensor 322 can be written to the memory device 302. For example, data retrieved and/or pulled from the image sensor 322 can be written to an array of memory cells of the memory device 302. The memory device 302 can be configured to map addresses of memory cells of an array of memory cells to which data from the image sensor 322 is written to columns and rows of a corresponding image array captured by the image sensor 322. The memory device 302 can map individual portions of an image array to individual memory cells to which data corresponding to those individual portions of the image array were written.

The memory device 302 can include logic circuitry 327. The logic circuitry 327 can be coupled to an array of memory cells of the memory device 302. The logic circuitry 327 is configured to perform one or more operations on data written to the memory device 302. For example, the logic circuitry 327 can be configured to perform one or more image processing operations on data from the image sensor 322 written to the memory device 302. Non-limiting examples of image processing operations include a compression operation; a frame buffer operation; an encoding, decoding, or scaling operation; a color space conversion operation (e.g., an artificial intelligence (AI) color space conversion); and an attention finding operation. The logic circuitry 327 can be configured to perform one or more logical operations in order to perform one or more image processing operations. In at least one embodiment, the logic circuitry 327 can be a component of sensing circuitry of the memory device 302, such as the sensing circuitry 106 described in association with FIG. 1. In at least one embodiment, the logic circuitry 327 can be an ASIC separate from the sensing circuitry.

The memory device 302 can include control circuitry, such as the controller 103, configured to direct performance of an operation, such as an image processing operation, by the logic circuitry 327 on data pulled from the image sensor 322 by the memory device 302 and/or data written to the memory device 302. Performing an image processing operation on data from the image sensor 322 prior to communicating the data to the ISP circuitry 326 can provide the data in a better format for processing by the ISP circuitry 326.

The control circuitry can be configured to direct communication of signaling indicative of data from the image sensor 322 to the memory device 302. The control circuitry can be configured to direct communication of signaling indicative of data from the memory device 302 to the ISP circuitry 326. The control circuitry can be configured to direct communication of signaling indicative of data from the ISP circuitry 326 to a host device (not shown).

The memory device 302 can be configured to ingest data directly from the image sensor 322. The memory device 302 can be configured to perform an image processing operation on the ingested data, using the logic circuitry 327, for example. The memory device 302 can be configured to direct communication of data ingested by the memory device 302 from the image sensor 322. The memory device 302 can be configured to direct communication of operated-on data from the memory device 302 to the ISP circuitry 326. The memory device 302 can be configured to direct communication of processed data from the ISP circuitry 326 to a different device.

The memory device 302 can be configured to direct writing of data, pulled directly from the image sensor 322, to the memory device 302. The memory device 302 can be configured to direct performance of an image processing operation on data written to the memory device 302. The memory device 302 can be configured to direct communication of operated-on data (data on which the image processing operation was performed) from the memory device 302 to the ISP circuitry 326 concurrently with writing of data directly from the image sensor 322 to the memory device 302.

The system 320 can be a component of a personal laptop computer, a desktop computer, a digital camera, a mobile telephone, an Internet-of-Things (IoT) enabled device, or a vehicle (e.g., an autonomous vehicle), among various other types of systems. For clarity, the system 320 has been simplified to focus on features with particular relevance to the present disclosure. The system 320 can be a component of an event recorder of a vehicle, such as an autonomous vehicle. An event recorder may also be referred to as a black box.

The memory device 302 can provide main memory for the system 320 or could be used as additional memory or storage throughout the system 320. By way of example, the memory device 302 can be a dual in-line memory module (DIMM) operated as DDR DRAM, such as DDR5, a graphics DDR DRAM, such as GDDR6, or another type of memory system. Embodiments are not limited to a particular type of memory device 302. Other examples can include RAM, ROM, SDRAM, PCRAM, RRAM, flash memory, and three-dimensional cross-point, among others. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased.

Although not illustrated in FIG. 3, the memory device 302 can include a state machine. The state machine can be configured to count clock cycles of the image sensor 322 so that the memory device 302 can direct retrieval of data from the image sensor 322. The memory device 302 can be configured to synchronize signaling indicative of a clock of the memory device 302 with signaling indicative of a clock of the image sensor 322.

Although not illustrated in FIG. 3, the memory device 322 can include registers configured to maintain pointers to start locations and stop locations of the memory device 302 at which data from the image sensor 322 is written. For example, a pointer to a start location can be indicative of a row and/or column of an array of memory cells of the memory device 302 (e.g., an address of the memory device 302) at which writing of data from the image sensor 322 started. A pointer to a stop location can be indicative of a row and/or column of an array of memory cells of the memory device 302 at which writing of data from the image sensor 322 stopped. The registers can be in a data path between a data port of the memory device 302 coupled to the image sensor 322 and a memory cell of the memory device 302.

Figure 4:
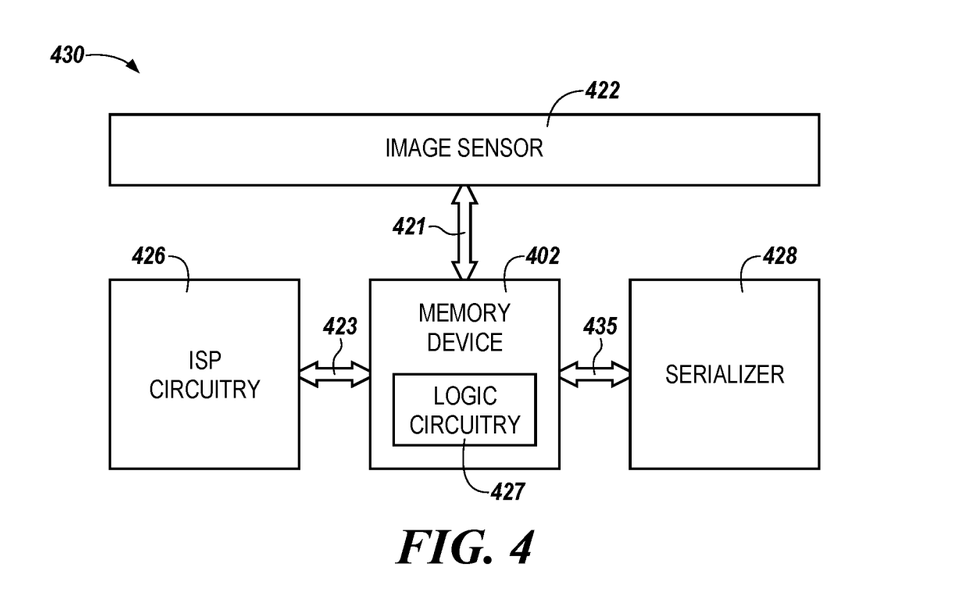
FIG. 4 is a block diagram of a system for pulling data directly from an image sensor using a memory device to a memory device in accordance with a number of embodiments of the present disclosure.

FIG. 4 is a block diagram of a system 430 for pulling data directly from an image sensor 422 using a memory device 402 in accordance with the present disclosure. The image sensor 422, the memory device 402, the ISP circuitry 426, and the serializer 428 can be analogous to the image sensor 322, the memory 302, the ISP circuitry 326, and the serializer 328 described in association with FIG. 3. The system 430 differs from the system 320 in that the coupling between the image sensor 422, and the memory device 402, ISP circuitry 426, and serializer 428 is different. The connections between the image sensor 422 and the memory device 402 (port 421) and between the memory device 402 and the ISP circuitry 426 (port 423) are analogous to those illustrated and described with respect to FIG. 3; however, the data pipeline is different.

In the system 430, the image sensor 422 is directly coupled to the memory device 402 via the port 421, as in the system 320. However, the memory device 402 is directly coupled to the ISP circuitry 426 via the port 423 as well as the serializer 428 via the port 435. In the system 430, the memory device 402 is coupled between the ISP circuitry 426 and the serializer 428. The memory device 402 is coupled between the image sensor 422 and the serializer 428.

The memory device 402 is configured to direct data transfers from the image sensor 422 to the memory device 402 and/or the ISP circuitry 426. The memory device 402 is configured to direct data transfers from the memory device 402 to the ISP circuitry 426 and/or the serializer 428.

FIG. 5 is a block diagram of a system 540 for directing, by a memory device 502, communication and processing of data from an image sensor 522 in accordance with the present disclosure. The image sensor 522, the memory device 502, the ISP circuitry 526, the serializer 528, and the logic circuitry 527 can be analogous to the image sensor 322, the memory 302, the ISP circuitry 326, the serializer 328, and the logic circuitry 327 described in association with FIG. 3. The system 540 differs from the system 320 and the system 430 described in association with FIGS. 3 and 4, respectively, in that the coupling between the image sensor 522 and the memory device 502, ISP circuitry 526, and serializer 528 is different. The connections between the memory device 502 and the ISP circuitry 526 (port 523) and between the memory device 502 and the serializer 528 (port 535) are analogous to those illustrated and described with respect to FIG. 4; however, the data pipeline is different.

In the system 540, the image sensor 522 is directly coupled to the ISP circuitry 526 rather than being directly coupled to the memory device 502 as was illustrated in FIGS. 1, 3, and 4. The memory device 502 and ISP circuitry 526 are coupled between the image sensor 522 and the serializer 528. However, the memory device 502 is configured to direct communication of data to and from components of the system 540. The memory device 502 is configured to direct communication of data from the ISP circuitry 526 to the memory device 502 via the first port of the memory device 502 (port 523). The memory device 502 is configured to direct communication of data from the memory device 502 to the ISP circuitry 526 via the first port of the memory device 502 (port 523). The memory device 502 is configured to direct communication of data from the memory device 502 to the serializer 528 via the second port of the memory device 502 (port 535). The memory device 502 is configured to direct communication of data from the serializer 528 to a component external to the system 540.

Although the memory device 502 is not directly coupled to the image sensor 522, the memory device 502 is configured to direct communication of data from the image sensor 522 to the ISP circuitry 526. The memory device 502 is configured to direct communication of data from the ISP circuitry 526 to the memory device 502. The memory device 502 is configured to direct communication of data from the memory device 502 to the ISP circuitry 526. The memory device 502 is configured to direct communication of data from the memory device 502 to the serializer 528. The memory device 502 is configured to direct communication of data from the serializer 528 to a component external to the system 540. For example, the memory device 502 can be configured to transfer data from the image sensor 522 to the ISP circuitry 526. The memory device 502 can be configured to transfer data from the ISP circuitry 526 to the serializer 528. The memory device 502 can be configured to transfer data from the serializer 528 to a host device.

As described in association with FIGS. 1, 3, and 4, the memory device 502 can be configured to perform operations, such as image processing operations, on data retrieved from the image sensor 522 by the memory device 502. Although the system 540 includes the ISP circuitry 526 being in the data path between the image sensor 522 and the memory device 502, the system 540 still enables the memory device 502 to perform operations on data retrieved from the image sensor 502. For example, the memory device 502 can be configured to perform one or more image processing operations on data retrieved from the image sensor 522 prior to the ISP circuitry 522 processes the data. The memory device 502 can be configured to perform one or more image processing operations on data retrieved from the image sensor 522 after the data has been processed by the ISP circuitry 526. Performing image processing operations on data before or after the data is processed by the ISP circuitry 526 can offload workloads from the ISP circuitry 526.

Figure 6:
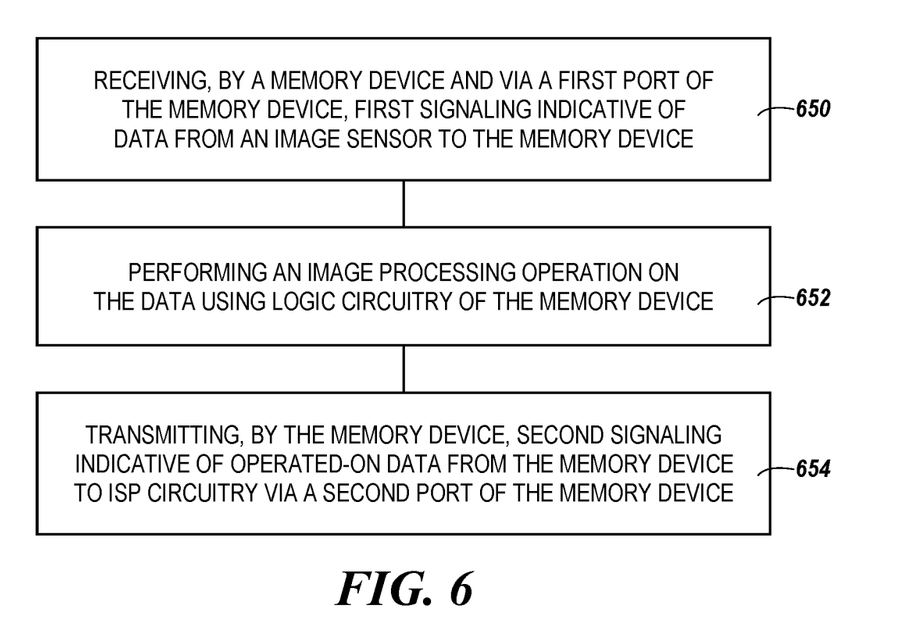
FIG. 6 is a flow diagram illustrating a method for receiving data from an image sensor using a memory device in accordance with a number of embodiments of the present disclosure.

FIG. 6 is a flow diagram illustrating a method for pulling data directly from an image sensor using a memory device in accordance with the present disclosure. The method described in association with FIG. 6 can be performed by, for example, the memory device 102 described in association with FIG. 1.

At block 650, the method can include receiving, by a memory device and via a first port of the memory device, first signaling indicative of data from an image sensor to the memory device. Receiving the first signaling can include writing the data to an array of memory cells of the memory device. A data path from the image sensor can be monitored by the memory device. The signaling indicative of data can be received by the memory device directly from the image sensor via the data path.

At block 652, the method can include performing an image processing operation on the data using logic circuitry of the memory device. The image processing operation can be performed on the data without interaction with a peripheral device or the ISP circuitry. Performing the image processing operation can include performing at least one logical operation on the data using the logic circuitry of the memory device.

At block 654, the method can include directing, by the memory device, communication of second signaling indicative of operated-on data from the memory device to ISP circuitry via a second port of the memory device. Signaling indicative of processed data can be communicated from ISP circuitry to a peripheral device via the second port of the memory device.

Embodiments can include a tangible machine-readable storage medium (also known as a computer-readable medium) on which is stored one or more sets of instructions or software embodying any one or more of the methodologies or functions described herein. In some embodiments, a memory device or a processing device constitutes a machine-readable medium. The term "machine-readable storage medium" includes a single medium or multiple media that store the one or more sets of instructions. The term "machine-readable storage medium" includes any medium that is capable of storing or encoding a set of instructions for execution by the machine and that cause the machine to perform any one or more of the methodologies of the present disclosure. The term "machine-readable storage medium" includes, but is not be limited to, solid-state memories, optical media, and magnetic media.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
   receiving, by a dynamic random access memory (DRAM) device and via a first port of the DRAM device directly coupled to an image sensor, first signaling indicative of data from the image sensor to the DRAM device;
   performing an image processing operation on the data using logic circuitry of the DRAM device; and
   transmitting, by the DRAM device, second signaling indicative of the operated-on data from the DRAM device to image signal processing (ISP) circuitry via a second port of the DRAM device directly coupled to the ISP circuitry.

2. The method of claim 1, wherein receiving the first signaling comprises writing the data to an array of memory cells of the DRAM device.

3. The method of claim 1, further comprising, directing, by the DRAM device, communication of third signaling indicative of processed data from the ISP circuitry to a peripheral device.

4. The method of claim 1, further comprising performing the image processing operation on the data without processing by a host device.

5. The method of claim 1, wherein performing the image processing operation comprises performing at least one logical operation on the data using the logic circuitry of the DRAM device.

6. A dynamic random access memory (DRAM) device, comprising:
   an array of memory cells of the DRAM device;
   a first port of the DRAM device;
   a second port of the DRAM device;
   logic circuitry of the DRAM device coupled to the array of memory cells and configured to perform an image processing operation on data written to the array of memory cells; and
   control circuitry of the DRAM device configured to:
     pull first signaling indicative of data directly from an image sensor via the first port;
     write the pulled data to the array of memory cells;
     direct performance of an image processing operation on the pulled data via the logic circuitry; and
     direct communication of second signaling indicative of the operated-on pulled data from the DRAM device via the second port.

7. The DRAM device of claim 6, wherein the circuitry is further configured to direct communication of the second signaling from the DRAM device to image signal processing (ISP) circuitry via the second port.

8. The DRAM device of claim 6, wherein the first port comprises a serial interface configured to receive the first signaling.

9. The DRAM device of claim 8, wherein the second port comprises a parallel interface configured to communicate the second signaling.

10. The DRAM device of claim 6, wherein the image processing operation comprises at least one of:
    a compression operation;
    a frame buffer operation;
    an encoding, decoding, or scaling operation;
    a color space conversion operation; and
    an attention finding operation.

11. The DRAM device of claim 6, wherein the circuitry is further configured to synchronize signaling indicative of a clock of the DRAM device with signaling indicative of a clock of the image sensor.

12. The DRAM device of claim 6, further comprising circuitry configured to map addresses of memory cells of the array to which the pulled data or the operated-on pulled data is written, to columns and rows of a corresponding image array captured by the image sensor.

13. A system, comprising:
    an image sensor;
    image signal processing (ISP) circuitry; and
    a dynamic random access memory (DRAM) device directly coupled to the image sensor via a serial interface and directly coupled to the ISP circuitry via a parallel interface,
    wherein the DRAM device is configured to:
      direct communication of first signaling indicative of data from the image sensor to the DRAM device;
      perform an image processing operation on the data; and
      direct communication of second signaling indicative of the operated-on data from the DRAM device to the ISP circuitry.

14. The system of claim 13, wherein the DRAM device is coupled between the image sensor and the ISP circuitry.

15. The system of claim 13, further comprising a serializer coupled to the ISP circuitry configured to receive third signaling indicative of processed data from the ISP circuitry.

16. The system of claim 15, wherein the serializer is a component of the ISP circuitry.

17. The system of claim 15, wherein the DRAM device is coupled between the ISP circuitry and the serializer.

18. The system of claim 13, wherein the DRAM device comprises:
- an array of memory cells; and
- a plurality of registers configured to maintain pointers to start locations and stop locations of the array of memory cells to which data from the image sensor is written.

19. The system of claim 18, wherein the plurality of registers are a component of a state machine of the DRAM device.

* * * * *